US006848876B2

(12) United States Patent
Babbs et al.

(10) Patent No.: US 6,848,876 B2
(45) Date of Patent: Feb. 1, 2005

(54) WORKPIECE SORTER OPERATING WITH MODULAR BARE WORKPIECE STOCKERS AND/OR CLOSED CONTAINER STOCKERS

(75) Inventors: Daniel J. Babbs, Austin, TX (US); William J. Fosnight, Austin, TX (US); Tim Cosentino, Waitsfield, VT (US); Mark Sammut, Shelburne, VT (US); Pascal Pinna, Burlington, VT (US); Russell Zemen, Austin, TX (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/760,147

(22) Filed: Jan. 12, 2001

(65) Prior Publication Data

US 2002/0094257 A1 Jul. 18, 2002

(51) Int. Cl.[7] .............................................. B65G 49/07
(52) U.S. Cl. .............................. 414/217.1; 414/331.05; 414/938
(58) Field of Search ........................... 414/223.01, 277, 414/331.05, 331.06, 331.1, 331.11, 217.1, 937, 938, 940; 198/347.2, 347.3

(56) References Cited

U.S. PATENT DOCUMENTS

| | | | | |
|---|---|---|---|---|
| 4,757,355 A | * | 7/1988 | Iizuka et al. ................... 353/25 |
| 4,867,629 A | * | 9/1989 | Iwasawa et al. ............. 211/163 |
| 4,886,412 A | * | 12/1989 | Wooding et al. ........ 414/416.05 |
| 4,986,715 A | * | 1/1991 | Asakawa ..................... 211/163 |
| 4,995,430 A | | 2/1991 | Bonora et al. ................ 141/98 |
| 4,999,671 A | * | 3/1991 | Iizuka ......................... 355/23 |
| 5,019,927 A | * | 5/1991 | Simone ....................... 360/92 |
| 5,059,079 A | | 10/1991 | Foulke et al. ............... 414/275 |
| 5,442,163 A | * | 8/1995 | Nakahara et al. ........... 235/375 |
| 5,464,313 A | * | 11/1995 | Ohsawa ...................... 414/172 |
| 5,628,604 A | * | 5/1997 | Murata et al. .............. 414/283 |
| 5,829,939 A | * | 11/1998 | Iwai et al. ................... 414/411 |
| 5,842,917 A | * | 12/1998 | Soung et al. ................ 454/187 |
| 5,972,727 A | * | 10/1999 | Ryan et al. ................. 250/548 |
| 6,099,230 A | * | 8/2000 | Hitch .................... 414/223.02 |
| 6,129,496 A | | 10/2000 | Iwasaki et al. ........ 414/222.01 |
| 6,135,698 A | | 10/2000 | Bonora et al. ............. 414/416 |
| 6,138,721 A | | 10/2000 | Bonora et al. ................ 141/98 |
| 6,142,722 A | * | 11/2000 | Genov et al. ............... 414/217 |
| 6,188,323 B1 | | 2/2001 | Rosenquist et al. ...... 340/686.5 |
| 6,364,595 B1 | * | 4/2002 | Bonora et al. ............. 414/416.1 |
| 6,403,905 B1 | * | 6/2002 | Conboy et al. ............. 209/563 |
| 6,414,744 B1 | * | 7/2002 | Kuiper et al. ................. 355/75 |
| 6,481,945 B1 | * | 11/2002 | Hasper et al. .............. 414/217 |
| 6,517,304 B1 | * | 2/2003 | Matsumoto ................. 414/217 |
| 6,612,797 B1 | * | 9/2003 | Bonora et al. .............. 414/217 |

FOREIGN PATENT DOCUMENTS

WO WO 99/02436 1/1999 .......... B65G/65/00
WO WO 99/65064 * 12/1999

* cited by examiner

Primary Examiner—James W. Keenan
(74) Attorney, Agent, or Firm—O'Melveny & Myers LLP

(57) ABSTRACT

A reticle management system is disclosed including a sorter coupled to one or more stockers that allow a customized configuration of the overall reticle management system. The stockers may be bare reticle stockers, closed container reticle stockers, or both. In embodiments of the present invention, the reticle management system includes between one and six individual bare reticle stockers and/or closed container stockers for storing reticles affixed to a reticle sorter. The sorter includes a reticle inspection station for inspecting the reticles, a plurality of input/output (I/O) load ports and a reticle handling robot for transferring the reticles between the stockers, the inspection station and the I/O load ports. The management system further includes a control unit for housing control electronics for the system.

1 Claim, 7 Drawing Sheets

WORKPIECE SORTER OPERATING WITH MODULAR BARE WORKPIECE STOCKERS AND/OR CLOSED CONTAINER STOCKERS

BACKGROUND OF THE INVENTION

1. Field of the Invention

The present invention relates to a reticle management system, and in particular to a reticle management system which includes a reticle sorter capable of operating with a plurality of modular bare reticle stockers and/or closed container stockers.

2. Description of Related Art

Semiconductor devices on wafers are made up of as many as fifty individual patterned layers of silicon, silicon compounds and metals. During fabrication of these devices, the pattern for each of these layers is contained on a mask called a reticle. A reticle is an optically clear quartz substrate on which a pattern has been formed by photolithography or other such processes. In particular, a layer of photoresist is applied on a chrome coated reticle blank. Thereafter, the pattern for a particular layer to be formed on a semiconductor wafer is transferred onto the reticle as for example by a laser pattern generator or e-beam. After pattern generation on the photoresist, the exposed portions of the photoresist are removed to leave the unwanted portions of the chrome layer exposed. These unwanted portions are then etched away. The remaining photoresist is then removed in a process which leaves the clean pattern on the surface of the reticle.

In order to keep the surface of the reticle clean, a thin transparent sheet called a pellicle is mounted a short distance away from the surface of the reticle containing the pattern. This ensures that any microscopic dust that settles on the reticle will be out of focus during the exposure process so as not to affect the pattern formed on the silicon wafer.

During fabrication of the reticle, it is important to minimize airborne particle fluxes onto the surface of the reticle on which the pattern is being formed, as any such particles can corrupt the pattern. Even after formation of the pattern and affixation of the pellicle, larger, or macro, contaminants can settle on the reticle which can interfere with pattern transference onto the semiconductor wafer. It is therefore advantageous to prevent particles from adhering to reticles during reticle fabrication, during storage of the reticles, during transfer of the reticle from the reticle fab to the semiconductor fab and during usage of the reticle in the semiconductor fab.

During semiconductor and reticle fabrication, it is known to store such workpieces within large storage units referred to as stockers. A conventional stocker for storing bare reticles is typically a large unit having a plurality of shelves on which the reticles may be stored, and a transport system for transferring reticles into and out of the stocker and for moving reticles around within the stocker.

Conventional reticle stockers can typically hold as many as 10,000 bare reticles. These units take up a considerable amount of space within a reticle or wafer fab, where space is at a premium owing to the requirement of clean room conditions. Moreover, there is currently no provision for customizing a stocker to given storage and space requirements of a particular reticle or wafer fab.

It is another consideration in a wafer fab whether to store workpieces such as reticles as individual, bare substrates or whether to store them within closed containers. Some semiconductor fabs are located in areas prone to seismic activity and/or have unreliable power supply. In the event of an earthquake or power outage (so that the fan/filter unit stops operating), there is less likelihood of damage to the workpieces if they are stored in closed containers. On the other hand, some semiconductor fabs are located in areas that have low seismic activity and reliable power supply, and protection of the workpieces against earthquakes and/or power outages is not as critical. These areas may choose to store bare reticles, with no container, as such storage systems generally take up less footprint in the clean room environment of the fab where space is always critical. At present, no single system exists which may be configured as desired by a particular manufacturer to address its particular workpiece storage needs.

SUMMARY OF THE INVENTION

It is therefore an advantage of the present invention to provide a modular reticle management system wherein the storage capacity and footprint of the system may be customized and scaled to the particular manufacturer's needs, or modified and redeployed after initial installation.

It is a further advantage of the present invention to provide a reticle management system which may be configured to operate with bare reticle stockers and/or with closed container stockers.

It is another advantage of the present invention to provide a distributed storage system in which a plurality of reticle management systems according to the present invention may be distributed throughout the fab to act as local storage systems for particular areas of the fab, or outside the fab as archives.

It is another advantage of the present invention that each reticle management system distributed throughout the fab may be customized for the particular area of the fab in which the system is located.

It is a further advantage of the present invention to provide improved reliability for fab-wide reticle sorting and storing, in that when a reticle handling robot malfunctions, the attached bare reticle stockers may be moved to another sorter in accordance with the present invention and processed.

It is a further advantage of the present invention to provide bare reticle stockers that provide reticle archiving capabilities upon being detached from the reticle management system and remotely stored.

It is a still further advantage of the present invention to provide an air flow control system which minimizes particles which may come to rest on the reticles within the reticle management system.

It is another advantage of the present invention to provide a reticle stocker including reticle sorting capabilities.

These and other advantages are provided by the present invention which in preferred embodiments relates to a modular reticle management system including a sorter coupled to one or more stockers that allow a customized configuration of the overall reticle management system. The stockers may be bare reticle stockers, closed container reticle stockers, or both. In embodiments of the present invention, the reticle management system includes between one and six individual bare reticle stockers and/or closed container stockers for storing reticles affixed to a reticle sorter. The sorter includes reticle inspection stations for inspecting the reticles, a plurality of input/output (I/O) load ports and a reticle handling robot for transferring the reticles between the stockers, the inspection stations and the I/O load ports. The management system further includes a control unit for housing control electronics for the system.

Each bare reticle stocker is formed of a plurality of coaxial and stacked carousels that include slots for vertically supporting the reticles. Each bare reticle stocker further includes a fan filter unit on a top portion of the unit. Each fan filter unit is capable of filtering the air within the reticle management system and circulating clean air through each bare reticle stocker to maintain the reticle management system in a clean room class 1 environment. In particular, clean air from the fan filter unit is circulated down through the center of each of the carousels. The slots in the carousels are open to the center of the bare reticle stocker, so that clean air is forced out of the slots and by the front and back surfaces of the reticles to carry away surface bound particles from the reticles and down the outside the outer circumference of the carousels.

It is a significant advantage that the reticle management system according to the present invention may be customized in several ways. For example, bare reticle stockers may be easily added and/or removed from the sorter. Thus, the number of bare reticle stockers as well as the footprint occupied by the reticle management system can be based on a manufacturer's space and reticle storage requirements. Additionally, the reticle management system may be configured with bare reticle stockers, for example where space is at a premium, or with closed container stockers, for example where controlling the environment around the reticle is most important. It is also contemplated that the reticle management system be configured with both bare reticle stockers and closed container stockers as a further option to manufacturers. Moreover, both the bare reticle stockers and closed container stockers may be scaled to different sizes to further address a manufacturer's space and reticle storage requirements.

Another advantage of the present invention is that, as opposed to a single, large, centralized stocker as found in the prior art, several reticle management systems according to the present invention may be distributed throughout the fab. In addition to providing local storage near each of the tools, each reticle management system may be customized as desired for the particular area of the fab in which the reticle management system is located.

BRIEF DESCRIPTION OF THE DRAWINGS

The present invention will now be described with reference to the drawings in which.

DETAILED DESCRIPTION

Preferred embodiments of the present invention will now be described with reference to FIGS. 1–12, which in general relate to a modular reticle management system which may be easily customized and scaled to particular manufacturer's space and storage requirements. While a preferred embodiment of the present invention relates to the storage and transfer of reticles, it is understood that the present invention may operate with other workpieces, including for example, semiconductor wafers and flat panel displays. Preferred embodiments of the present invention comply with and allow compliance with all applicable SEMI standards. However, it is understood that the present invention need not conform to SEMI standards in alternative embodiments.

Figure 1:
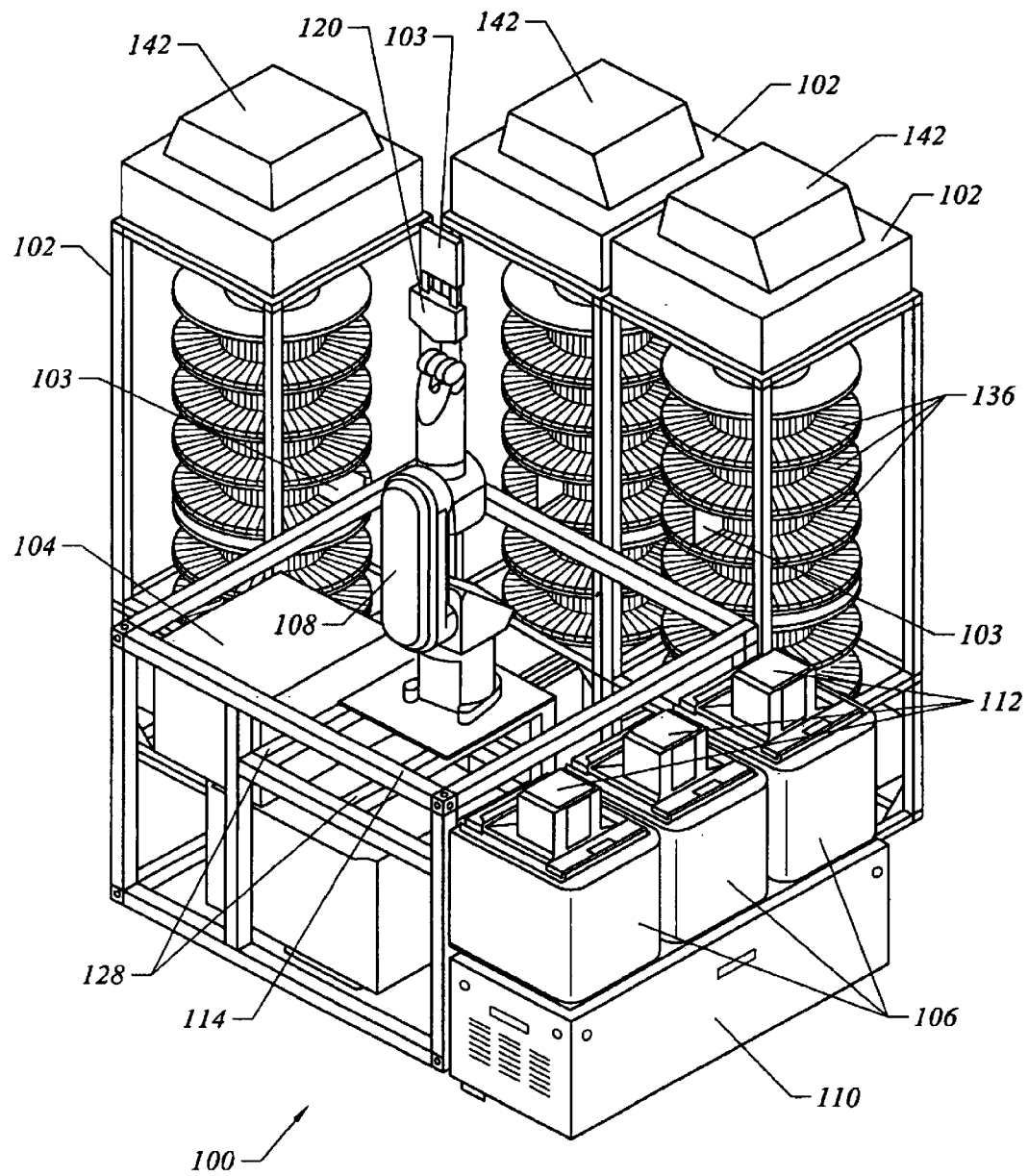
FIG. 1 is a perspective view of a modular reticle management system with the cover panels removed to show the interior of the system.

Referring now to FIG. 1, there is shown a reticle management system 100 comprising a central reticle sorter 101 to which are secured one or more individual bare reticle stockers 102, each capable of storing reticles 103. The sorter 101 includes a plurality of reticle inspection stations 104 for inspecting the reticles, a plurality of input/output (I/O) load ports 106 and a six-axis robot for transferring reticles 103 between the bare reticle stockers 102, inspection station 104 and I/O load ports 106. The management system 100 further includes a control unit 110 for housing control electronics for the system 100. Each of these components is described in greater detail below. Sorter 101 operates as does a conventional sorter to perform various operations on reticles 103, such as for example sorting and transferring reticles between various containers seated on I/O load ports 106, and performing various inspections of the reticles at inspection station 104.

I/O load ports 106 are preferably identical to each other, and while only one load port 106 will be described hereinafter, the following description applies to each of the load ports. It is understood that in alternative embodiments, the I/O load ports 106 need not be identical to each other. Each I/O load port 106 is capable of receiving a SMIF pod housing a reticle-carrying cassette 112. The I/O load ports 106 receive the pods either manually or automatedly, and thereafter separate the SMIF pod shell from the SMIF pod door to allow access to the reticle cassettes 112 therein. Although not critical to the present invention, a pod is received on the I/O load port 106 so that a door of the pod seats on an inner support plate and the pod shell seats on an outer support plate surrounding the inner support plate. Once positioned, the pod door is separated from the pod shell by means of a latch mechanism provided substantially beneath the inner support plate. Although not critical to the present invention, details relating to such a latch mechanism are described in U.S. Pat. No. 4,995,430 entitled, "Sealable Transportable Container Having Improved Latch Mechanism", which patent is assigned to the owner of the present application, and which patent is incorporated by reference in its entirety herein. The outer support plate may include retaining clips for securing the pod shell on the outer support plate.

Once separated, the inner support plate with the pod door and reticle(s) supported thereon index downward by means of an elevator within the load port. The pod top remains in position on the outer support plate to maintain a sealed environment within the load port. Once lowered into the load port, the robot 108 described hereinafter can transfer the reticle away from and back to its position on it support surface or within its cassette.

Although an indexer-type load port is described above, the type of load port used with reticle management system 100 is not critical to the present invention and other load port assemblies are contemplated. For example, while I/O load ports 106 are disclosed as bottom opening systems, it is understood that I/O load ports 106 may alternatively be front loading systems which operate with front opening unified pods (FOUPs). Moreover, technologies other than SMIF system may be utilized. For example, the present invention may be configured to interface with containers including Toppan clam shells, Hoya cassettes, Canon boxes and Nikon boxes, all well known in the art. While FIG. 1 illustrates three I/O load ports 106, it is understood that there may be more or less than that in alternative embodiments.

Each of the I/O load ports 106 may be supported on and mounted to a shelf extending from a central frame 114. The I/O load ports 106 may additionally be anchored to the frame 114 itself. Although not shown in FIG. 1 so as to make clear the internal components, sorter 101 preferably includes sealing panels 109 (FIG. 7) affixed to frame 114 which substantially seal the sorter against the external environment. As explained in greater detail below, the sorter 101 and attached stockers 102 are maintained at an elevated pressure relative to the surrounding environment so that any particulates are forced out of the sorter through any open spaces, as opposed to being drawn in. When a sorter 102 is affixed to a side, the panels 109 on that side are removed.

Alternatively, panels 109 may include an elongated slot similar to elongated slot 160 (FIG. 6) explained hereinafter. According to this embodiment, the panels are not removed when a stocker is to be added, but the elongated slot in the panels 109 is aligned with the elongated slot 160 to allow reticle transfer between the sorter 101 and the bare reticle stocker 102. The elongated slot in panel 109 is small enough that the sorter is maintained at a positive pressure relative to the surrounding environment by a fan filter unit in the sorter so that particulates from the surrounding environment are prevented from entering into the sorter in the absence of a stocker affixed thereto.

Figure 1A:
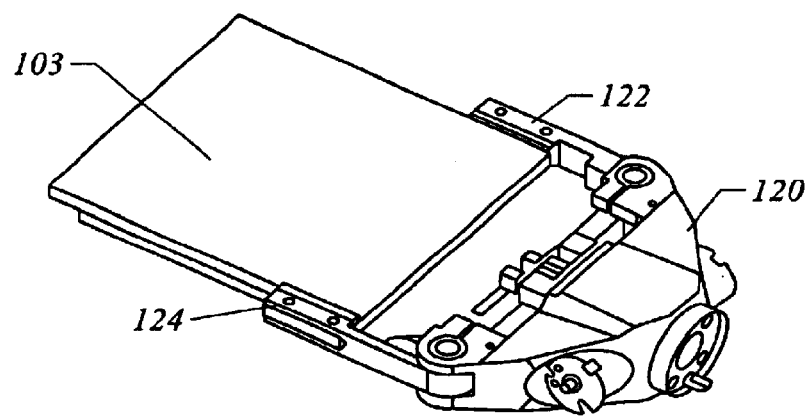
FIG. 1A is an enlarged perspective view of the end effector of the robot according to the present invention.

Reticle transfer robot 108 is provided for transferring reticles to and from cassettes 112 and around within reticle management system 100. Robot 108 is preferably a six-axis robot of a known construction, such as for example the RX60 Robot manufactured by Stäubli AG of Zurich, Switzerland. Such robots include rotation about six independent axes so as to position an end effector 120 of the robot at a wide variety of positions and orientations within the reticle management system 100. End effector 120 may include a pair of fingers 122 and 124 as shown in FIG. 1A which come together to grip the reticles along a portion of their sides so that the reticles can be transferred to and from the reticle cassettes and bare reticle stocker support positions as explained hereinafter.

As would be appreciated by those of skill in the art, other robot and end effector designs are contemplated which are capable of transferring reticles to and from reticle cassettes 112 and for transferring reticles 103 around within the three dimensional space defined by the reticle management system 100 to allow reticle transfer to and from the bare reticle stockers 102 as explained in greater detail hereinafter.

Reticle management system 100 may further include a plurality of reticle inspection stations 104 within sorter 101 (one such inspection station shown symbolically in FIG. 1). In a preferred embodiment, four such inspection stations may be provided within sorter 101. A first inspection station may be an automated inspection station. This inspection station receives a reticle, and uses optical sensors to inspect for particles and scratches on the reticles and tears in the pellicles.

If particles, scratches or tears are detected, the reticle may be transferred to a second inspection station—a visual bright-light inspection station. This station includes a bright light and a blow-off nozzle. In operation, if a particle or particles are detected on the reticle in the automated inspection station, the location of the particle(s) is noted by the controller and the end effector 120 positions the reticle in the visual bright-light inspection station so that the particle positioned adjacent the blow-off nozzle. The nozzle blows deionized nitrogen or ultraclean air onto the reticle in an attempt to remove the particle. The pressure of the gas from the nozzle may be adjusted depending on whether the particle is detected on the reticle or pellicle, with the pressure being slightly less for particles on the pellicle to prevent tearing of the pellicle by the cleaning gas. Instead of positioning select portions of the reticle under the blow-off nozzle, the end effector may instead position and move the reticle under the nozzle so that the nozzle blows across the entire surface of the reticle and/or pellicle. Moreover, the controller may have various algorithms for moving the end effector holding the reticle under the blow-off nozzle in defined patterns to maximize the likelihood of removing the particle(s).

Once the automated blow-off process described above has been performed, the reticle is again inspected for particles. This is preferably performed in the automated inspection station, but may alternatively be performed in the visual bright-light inspection station. If no particles are detected, the reticle is transferred away from the automated and visual bright-light inspection stations. If particles are still detected, or if the reticle includes scratches or the pellicle includes tears, the reticle is transferred back to the visual bright-light inspection station and an alarm may sound to summon an operator.

At this point, control of the end effector 120 is transferred to a manual 3-D mouse of known construction, which allows the operator to manipulate the reticle so that the operator can visually inspect the reticle and/or pellicle under the bright light. It also allows the operator to position the reticle or under the blow-off nozzle as desired. The operator can also visually inspect any scratches or tears. If the particles cannot be removed, or if the scratches or tears warrant, the reticle can be transferred to the appropriate container.

Before inspection at the automated and visual bright-light inspection stations, the reticle is preferably passed by the robot to a reticle identification station which may include an optical reader of known construction, such as for example a bar code reader, for reading a bar code on reticle. The reticle may also be passed to a pellicle frame identification station comprising an orienter and an optical reader of known construction, such as for example a charge couple display (CCD) camera for reading a marking on the pellicle frame to identify the type of pellicle frame being used.

It is understood that one or more of the above-described inspection stations may be omitted in alternative embodiments of the invention.

In accordance with the present invention, reticle management system 100 may further include one or more bare reticle stockers 102 docked along one, two or three sides of sorter 101, with the I/O load ports 106 and controller 110 occupying the fourth side. As discussed hereinafter, the sorter 101 may have a geometric footprint other than square or rectangle in alternative embodiments of the present invention, in which case bare reticle stockers may be provided along more than three sides of the system 100. The individual bare reticle stockers may be properly positioned and secured to the sorter 101 via various mounting systems. One such mounting system may comprise adjustable leveling feet 132 (FIG. 4) to properly orient the stockers 102 and known fastening schemes such as screws to affix the stocker to the sorter. An alternative system for precision mounting of the bare reticle stocker 102 to the sorter is disclosed in U.S. Pat. No. 6,138,721 to Bonora et al., entitled, "Tilt and Go Load Port Interface Alignment System," which patent is assigned to the owner of the present invention and which patent is incorporated by reference herein in its entirety. As disclosed in that patent, a socket assembly mounted on a lower portion of the stocker may mate over a ball mounted on a lower portion of the sorter. Once the socket is seated over the ball, various leveling and securing mechanisms as disclosed in the patent can be used to affix the stocker to the sorter in the proper alignment.

Each bare reticle stocker 102 is preferably identical to each other, and one such unit is described hereinafter with the understanding the following description applies to each of the units. Referring now to FIGS. 1–4 and 6, each bare reticle stocker 102 is mounted within a cabinet defined by a frame 130 to which is secured a plurality of panels 131 (FIG. 6—omitted from the other drawings to show the detail of the internal components). The bare reticle stockers 102 are preferably supported on the floor by adjustable leveling feet 132 (FIG. 4) which may be adjusted to ensure a vertical orientation of the stockers 102. Coasters 134 may further be provided on the bottom of the stockers 102 that allow the stockers 102 to be easily transported upon retraction of leveling feet 132.

Bare reticle stockers 102 further include a plurality of coaxial and stacked annular carousels 136 for supporting the reticles 103. The number of carousels 136 which may be stacked on top of each other may be easily varied to allow the height of the bare reticle stockers to be scaled as desired to a particular manufacturer's needs. In the embodiment shown in FIG. 1, each bare reticle stocker includes six stacked carousels, while the embodiment shown in FIGS. 2 and 4 includes seven stacked carousels. It is understood that the number of stacked carousels may be more or less than that shown in the figures in alternative embodiments.

In a preferred embodiment, the robot 108 has sufficient stroke along the Z-axis to access the top and bottom carousels, as well as each of the carousels in between. However, in an alternative embodiment, the number of stacked carousels may be increased so that the height of the stacked carousels exceeds the Z stroke of the robot. In this embodiment, the stacked carousels may be affixed to a linear drive capable of moving the carousels along the Z axis. Thus, there may be 10 or more stacked carousels. In this embodiment, the vertical movement of the robot may be coordinated with the vertical movement of the stacked carousels to allow access to each of the carousels by the robot.

The stacked carousels 136 are mounted to a central shaft 138 which is in turn rotated by a motor (not shown) of known design in the bottom of each of the bare reticle stockers 102. The motor may be a stepper or multi-pole brushless motor. As would be appreciated by those of skill in the art, the drive shaft of the motor may be coaxial with shaft 138, or alternatively, the drive shaft of the motor may be offset from shaft 138 in which case a torque transfer system such as gear or belt assemblies would transfer torque from the drive shaft to shaft 138 to rotate stacked carousels 136. The motor may further include an encoder to allow closed loop servo control of the rotational position of the stacked carousels.

Each carousel includes a plurality of slots 140 radially oriented out from a center of the carousels, which slots are provided for supporting reticles 103 at their edges in a vertical orientation such as shown in FIG. 1. In one embodiment, each carousel includes 483 slots for supporting 483 reticles. It is understood, however, that the number of slots provided and reticles supported within each carousel may be greater or lesser than that in alternative embodiments. This configuration allows for a high reticle packing density as well as aiding in the maintenance of a clean room class 1 environment as explained below. The slots 140 may be slightly inclined, sloping downward approximately 5° for example, toward the center of the carousel. Thus, upon seismic activity or other shock to the stocker, the reticles are less likely to fall out of their slots. It is understood that the slope angle may be greater than 5°, or between zero and 5°, in alternative embodiments.

The fingers 122, 124 on end effector 120 (FIG. 1A) grip only a portion of the sides of the reticle 103, thus allowing for easy transfer of the reticle between the end effector 120 and slots 140. The reticles seat within the slots 140 with a portion of the reticles extending past the end of the shelves so that the fingers 122, 124 may easily reacquire the reticles from the slots. This allows tight reticle packing density around the circumference of the carousel. In an alternative embodiment of the invention, it is contemplated that each slot 140 be deep enough to hold two reticles, both vertically oriented along a radial out from a center of the carousel. In such an embodiment, the outer reticle must first be removed if it is desired to access the inner reticle.

Figure 9:
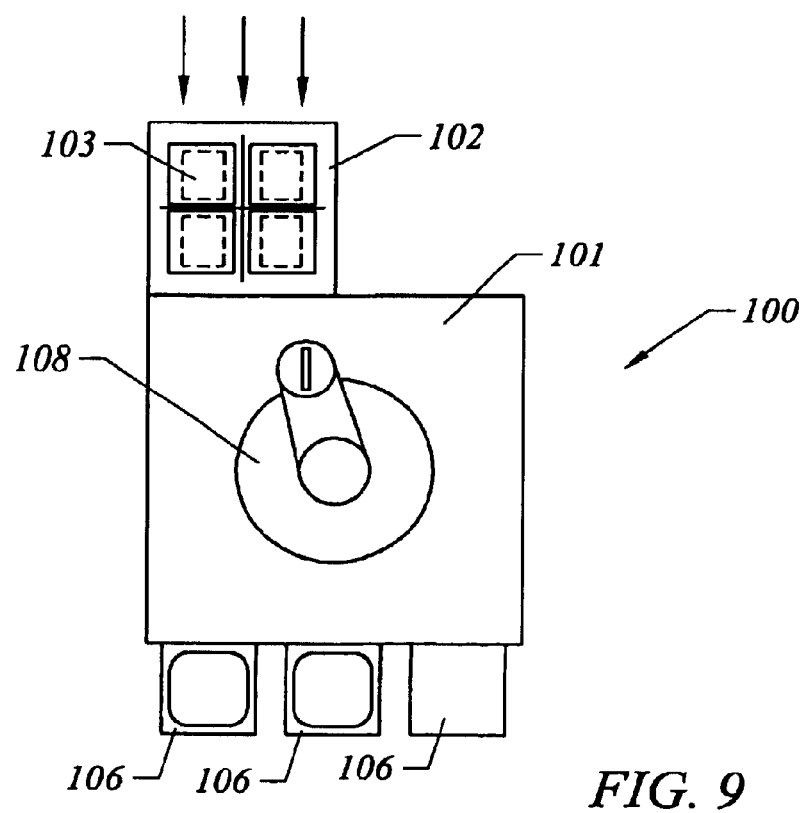
FIG. 9 is a top view of a reticle management system according to an alternative embodiment of the invention.

While the reticles are vertically stored in a preferred embodiment, it is understood that the reticles may be stored within bare reticle stockers 102 in a horizontal orientation in alternative embodiments. Such an embodiment is shown in FIG. 9. This embodiment may include a carousel divided into four quadrants, each quadrant having a plurality of stacked slots for holding reticles 103.

The spacing between each slot 140 on a carousel 136 is preferably the same as the spacing between each slot on each other carousel 136. A slot 140 in a carousel 136 is also preferably aligned directly above and/or below a slot 140 in the next adjacent carousel 136. This allows an entire column of slots 140 from the stacked carousels 136 to be aligned for receiving reticles from robot 108 as explained in greater detail hereinafter. It is understood that the spacing between slots 140 in respective carousels 136 and the alignment of slots 140 between adjacent carousels 136 may be different in alternative embodiments of the present invention.

Figure 11:
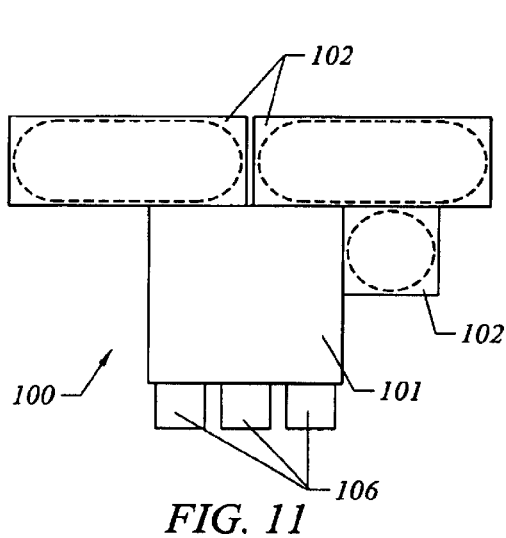
FIG. 11 is a top view of a reticle management system operating with bare reticle stockers according to an alternative embodiment of the present invention.
Figure 12:
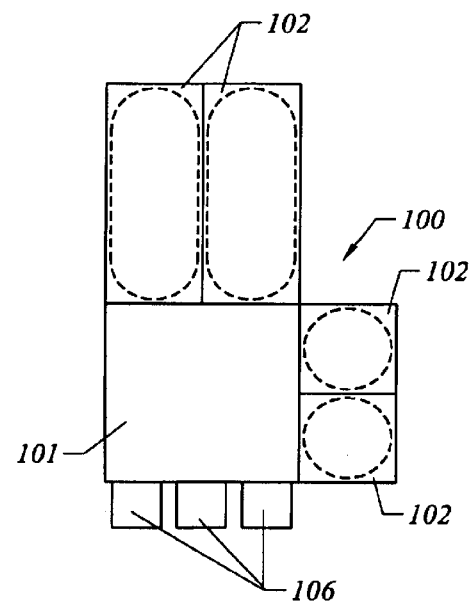
FIG. 12 is a top view of a reticle management system operating with bare reticle stockers according to a further alternative embodiment of the present invention.

While the carousels are preferably circular, it is understood that they may be other shapes in alternative embodiments. For example, as shown in FIGS. 11 and 12, the carousels may be oblong, with each of the reticle support slots 140 affixed to a flexible, driven belt. In the embodiment of FIG. 11, there would be a left hand stocker and a right hand stocker, each having a first end with an elongated slot 160 adjacent the sorter for receiving reticles from robot 108, and a second end extending out beyond the ends of the sorter. It is also contemplated that the elongated slot 160 be proved on the ends of the stockers as shown in FIG. 12, with the second end extending out away from the sorter.

Figure 7:
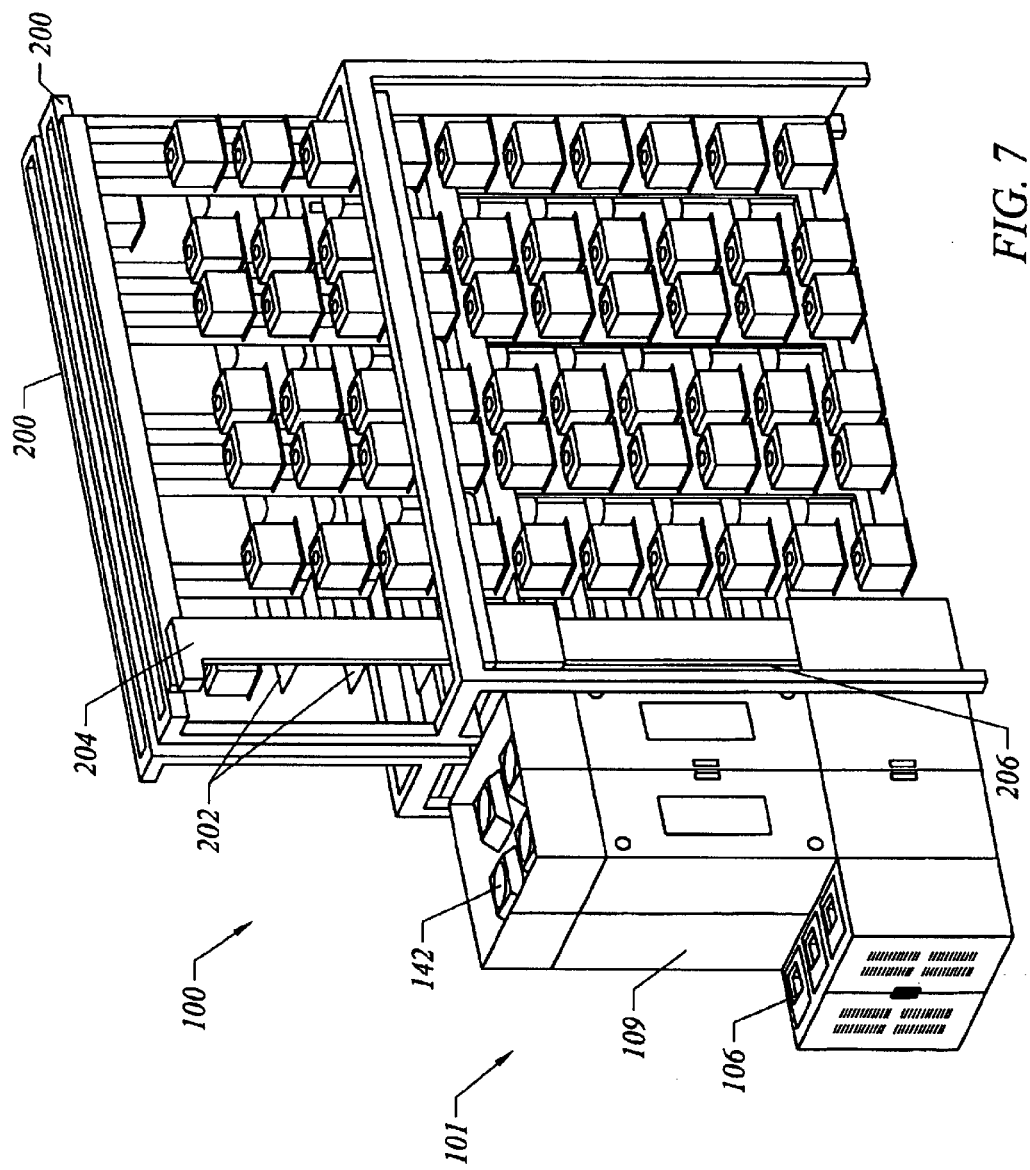
FIG. 7 is a perspective view of an alternative embodiment of the present invention including a plurality of closed container stockers.

Each bare reticle stocker 102 further includes a fan filter unit 142 of known construction mounted on a top portion of the stocker 102. As shown in FIG. 7, the sorter 101 may also include one or more fan filter units 142. Each fan filter unit 142 is capable of filtering the fluid within reticle management system 100 and for circulating clean air through each bare reticle stocker and sorter to maintain reticle management system in a clean room class 1 environment. The fan filter units 142 also provide an elevated pressure within the sorter 101 and stockers 102 relative to the surrounding environment. As between the sorter 101 and stockers 102, the stockers are maintained at a higher pressure to ensure air flow from the stockers 102 to the sorter 101 and then out to the surrounding environment. Thus, any particulates within the robot, as for example generated upon robot maintenance, will not enter into the attached stockers.

Figure 5:
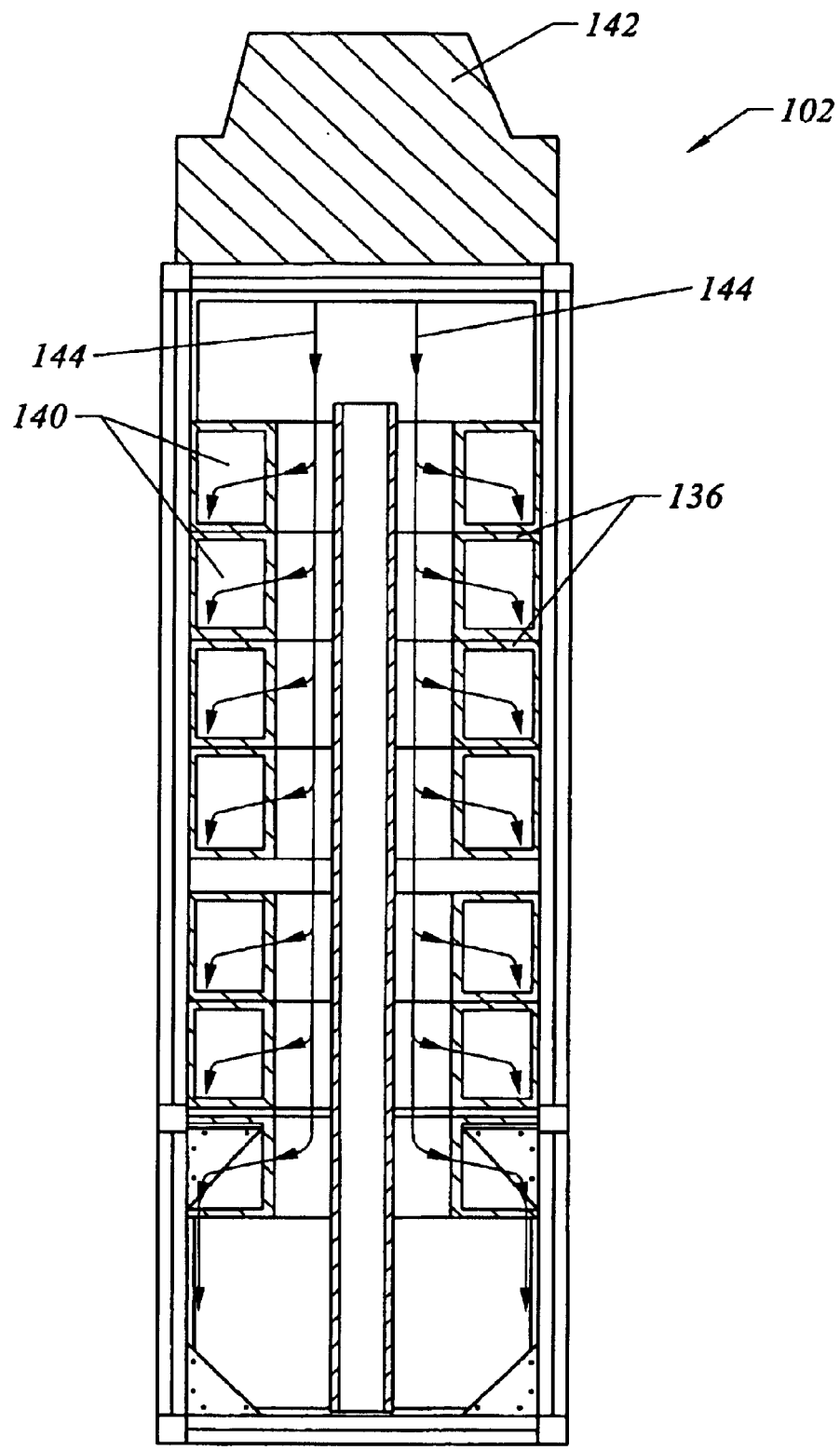
FIG. 5 is a cross-sectional view as in FIG. 4 showing the air flow path from the fan filter unit according to the present invention.

Referring in particular now to FIG. 5, clean air from fan filter unit 142 is circulated down through the center of each carousel 136 as indicated by air flow paths 144. As slots 140 in carousels 136 are open to the center of the bare reticle stocker, air is forced out of slots 140 along flow paths 144. The air passes by the front and back surfaces of the vertically oriented reticles 103 supported within slots 140 to carry away surface bound particles from the reticles. Although not shown in FIG. 5, clean air from fan filter unit 142 is also circulated down around the outside of each of the carousels 136 so that, after passing by reticles 103, the air is carried downward and out of bare reticle stockers 102 through a perforated plate at the bottom of the units.

An advantage of this system is that, after the clean air from the fan filter unit 142 passes by a reticle and picks up particles from the reticle, that air does not pass by another reticle, where it could otherwise redeposit the particles. Clean air passes from fan filter unit 142 past a single reticle and then out a bottom of a bare reticle stocker 102. Moreover, particulates are most likely generated where the end effector 120 contacts the reticles 103, or where the reticles 103 contact the slots 140. The air flow system according to the present invention assures that any particulates generated at these locations are swept away from, and not towards, the reticles in the carousels.

In an alternative embodiment, to ensure even air flow to each of the stacked carousels 136, a plurality of air delivery systems can be provided within the center of the stocker 102 so that some delivery systems deliver clean air directly to the top carousels, some delivery systems deliver clean air directly to the middle carousels, and some delivery systems deliver clean air directly to the bottom carousels. It is further contemplated that each carousel have an associated air delivery system.

In a further embodiment of the present invention, each of the carousels may include a baffle within its center for controlling air flow past the reticles. In one embodiment, the baffle is rotatable with respect to the carousel, and has a plurality of apertures generally matching the size of the openings of the reticle slots 140 to the center of the carousel. In order to allow maximum air flow through the reticle slots 140, the baffles may be fully open, i.e., the apertures align directly with the openings of the reticle slots to the center of the carousel. To reduce air flow through the reticle slots 140, the baffle may be partially closed, i.e., the apertures are slightly offset from the openings of the reticle slots to the center of the carousel, thereby effectively decreasing the size of the openings. In order to provide an even flow rate over the entire column of carousels, the baffles toward the top of the carousel stack may be more closed than the baffles toward the bottom of the stack.

In the embodiment of FIG. 9 including horizontally supported reticles, a plenum (not shown) may be provided on the back side of the stockers, i.e. distal from the sorter, for directing air flow in the direction of the arrows through the stocker and toward the sorter. This airflow removes particles away from the reticles, and the direction ensures that particles from the sorter do not make it into the stocker.

Referring again to FIG. 1, controller 110 includes control electronics and power components for controlling each of the docked bare reticle stockers 102, inspection station 104, I/O load port 106 and robot 108. Controller 110 may further provide operator feedback and information over a graphical user interface (not shown). In a preferred embodiment, controller 110 is located beneath the I/O load port 106. However, it is understood that the controller 110 may be located to a side or remotely from the reticle management system 100 in alternative embodiments. The ability to locate the controller 110 at different locations adds a level of flexibility to the present invention and further allows a manufacturer to customize the reticle management system 100 as desired. Moreover, as all of the electronics and power components are centralized within controller 110 in an easily accessible housing, maintenance, upgrade and/or replacement of the components within controller 110 is made relatively easy. As is discussed in greater detail below, bare reticle stockers 102 may be quickly and easily added to or removed from the reticle management system 100. Upon addition of a new bare reticle stocker 102 to the management system 100, a technician can reconfigure the controller 110 via the graphical user interface to coordinate the operation of the new unit with the system 100. It is also contemplated in an alternative embodiment that each bare reticle stocker 102 is essentially a "plug and play" component. In such alternative embodiments, the controller includes software for recognizing a new bare reticle stocker and thereafter coordinating the operation of the new unit with the management system.

In operation, a reticle is obtained from reticle cassette 112, and transferred to the reticle inspection station 104. The inspection station may then perform various tests and monitoring operations on the reticle. One such operation may comprise identification of each reticle by its associated OCR mark (this mark may alternatively be read upon extraction from a reticle cassette). After the inspection at station 104, the reticle may be reoriented from a horizontal to a vertical position and inserted into the desired slot 140 within a carousel 136 of a selected bare reticle stocker 102. The controller 110 stores the reticle identification together with the location (bare reticle stocker, carousel and slot) at which the reticle is stored. This operation may be reversed to load reticles from a storage shelf into a cassette 112 on a load port 106.

In a preferred embodiment, each stocker 102 may also include a data storage device which stores reticle identification and location information for each reticle in that stocker. Thus, if that stocker is moved to another sorter, the stored information for each reticle can be relayed to the new sorter.

Figure 6:
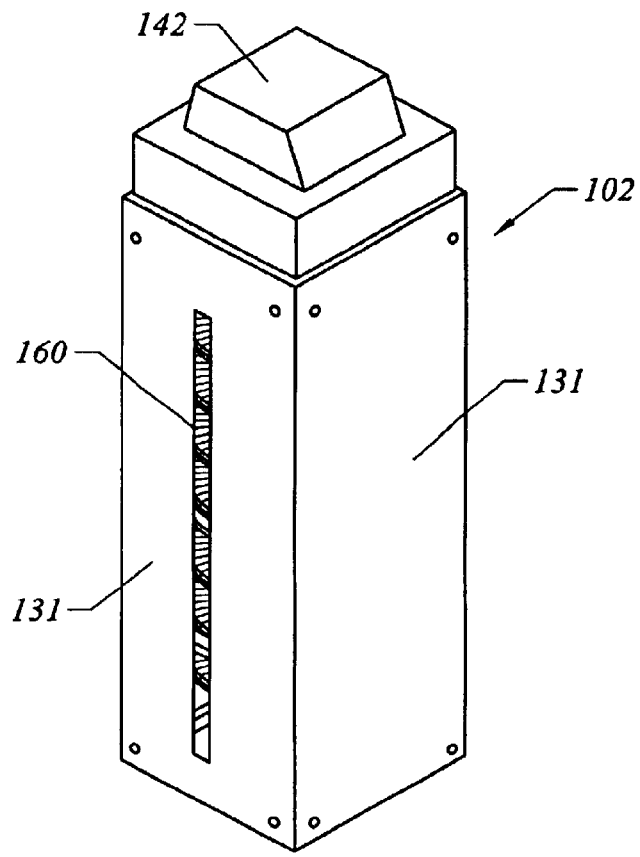
FIG. 6 is a perspective view of an individual bare reticle stocker showing the enclosing panels.
Figure 3:
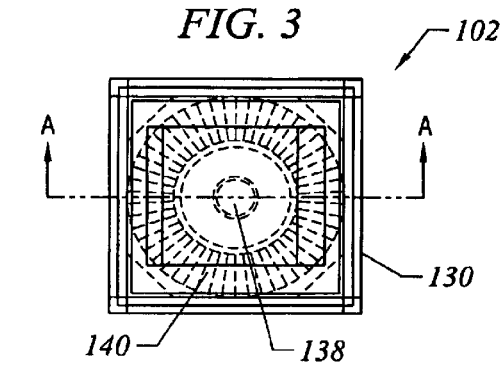
FIG. 3 is a cross-sectional top view through the interior of an individual bare reticle stocker.
Figure 4:
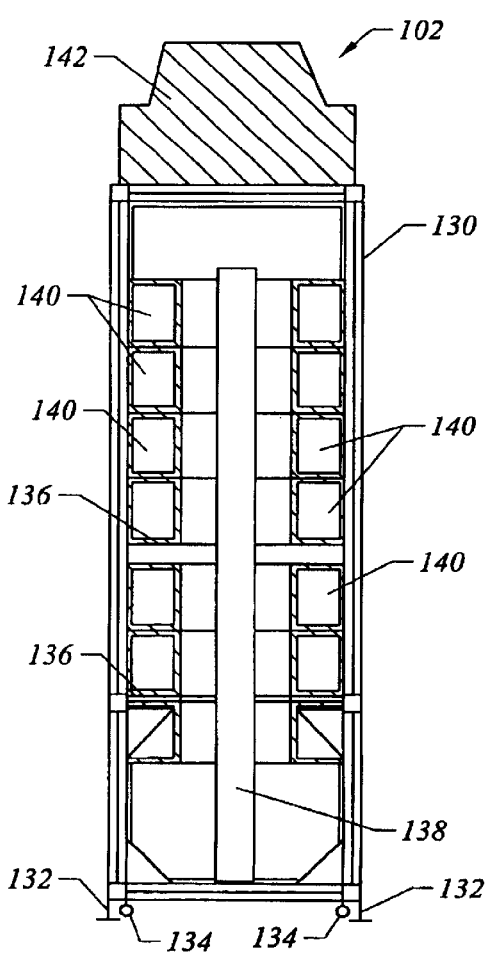
FIG. 4 is a cross-sectional view through section A—A in FIG. 3.
Figure 2:
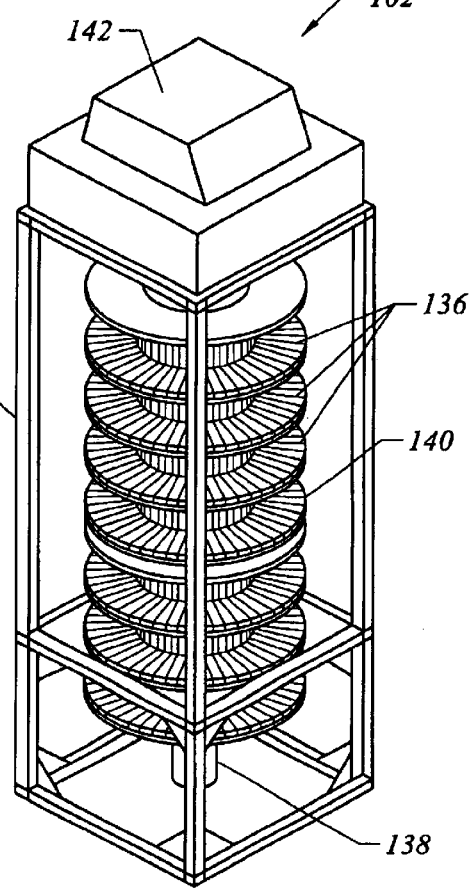
FIG. 2 is a perspective view of an individual bare reticle stocker for use with the reticle management system of FIG. 1.

Referring to FIG. 6, in a preferred embodiment, reticles are transferred to and from a column of slots 140 through an elongated slot 160 formed in front panel 131 in the bare reticle stocker. The elongated slot 160 is small enough that the stocker is maintained at a positive pressure relative to the surrounding environment by a fan filter unit 142 so that particulates from the surrounding environment are prevented from entering into the stocker.

Once a column of slots 140 from respective carousels 136 in a given bare reticle stocker 102 has been filled with reticles 103, the motor in the base of that stocker 102 may advance the stacked carousels one slot to present a new column of slots 140 into alignment with elongated slot 160 and the robot 108.

In conventional stocker designs, the transport apparatus had to be taught the location of each storage shelf. This necessity is obviated in the present invention by having stacked carousels that are controlled to advance a single slot at a time. At most, the robot is manually taught the position of the slot in the uppermost carousel and the position of the slot in the lowermost carousel, and the robot can thereafter access each slot in the stacked carousels as they rotate. In an alternative embodiment, the robot can automatedly learn the positions of the slots. Such an embodiment is taught in U.S. patent application Ser. No. 09/729,463, to Hine et al., entitled "Self Teaching Robot," which application is assigned to the owner of the present invention and which application is incorporated by reference in its entirety herein. The robot is always transferring reticles to and from the carousels along the same vertical line, and separate controls are not required for aligning a column of slots with the robot upon each rotation of the stacked carousels. However, it is understood that in alternative embodiments, a closed loop servo control may be provided for checking alignment of a column of slots with the robot 108. Moreover, it is understood that not all slots in a single column need to be accessed before the carousel rotates.

It is an advantage of the present invention that the plurality of I/O load ports 106 may be used to sort the reticles stored within the reticle management system 100. Such sorting capabilities are conventionally performed only in a reticle sorter. However, the plurality of I/O load ports 106 allow one or more reticles to be transferred between the various cassettes positioned on I/O load ports 106. This process may relocate the reticles in the same order as in the original cassette(s) or in a different order than in the original cassette(s) as desired. The I/O load ports 106 may additionally map the location of reticles within a cassette, and detect incorrect positioning of reticles within a cassette. Details relating to an example of a system for mapping workpieces and detecting workpiece position within a cassette are disclosed for example in U.S. Pat. No. 6,135,698, to Bonora et al., entitled "Universal Tool Interface and/or Workpiece Transfer Apparatus for SMIF and Open Pod Applications," which patent is assigned to the owner of the present application and which patent is incorporated by reference herein in its entirety, and in U.S. patent application Ser. No. 09/173,710 entitled "Wafer Mapping System," which application is assigned to the owner of the present application and which application is incorporated by reference herein in its entirety.

In accordance with a further aspect of the present invention, bare reticle stockers 102 may be easily added to and removed from the reticle management system 100. Thus, the number of bare reticle stockers as well as the footprint occupied by the reticle management system 100 can be based on a particular manufacturer's space and reticle storage requirements. As such, the present invention provides a reticle management system which may be easily scaled and customized to a manufacturer's particular needs. Removal of the reticle stockers also greatly facilitates access to the interior of the sorter, to allow for robot maintenance, inspection station maintenance, etc. Additionally, once reticles are loaded into a bare reticle stocker 102, the stocker 102 may be removed and stored remotely to provide reticle archiving. Alternatively, a loaded bare reticle stocker 102 may be removed from the management system 100 and transferred elsewhere within the fab, for example, to a second reticle management system 100. Thus, the present invention further provides bulk storage and transfer of a large number of reticles.

It is a still further advantage that the reticle management system may also be modified and redeployed after initial installation, further adding to the flexibility of the present invention. Furthermore, if a sorter malfunctions, the affixed bare reticle stockers 102 may be removed and wheeled to a new sorter, whereupon processing of those reticles can continue. Thus, the reticle management system of the present invention is capable of improving the overall reliability of fab-wide reticle sorting and storing.

Each of the bare reticle stockers 102 may further include an on-board, back up power supply, such as for example a battery. Thus, in the event of a power outage, power may still be supplied to the fan filter unit 142 to remove particles from the reticles. Moreover, in the event of a power outage, the back-up power supply can lock the rotational position of the stocker 102 in place. Thus, if power was lost in the middle of reticle transfer to a slot 140, the stocker is prevented from rotating which could otherwise damage or break the reticle.

Figure 8:
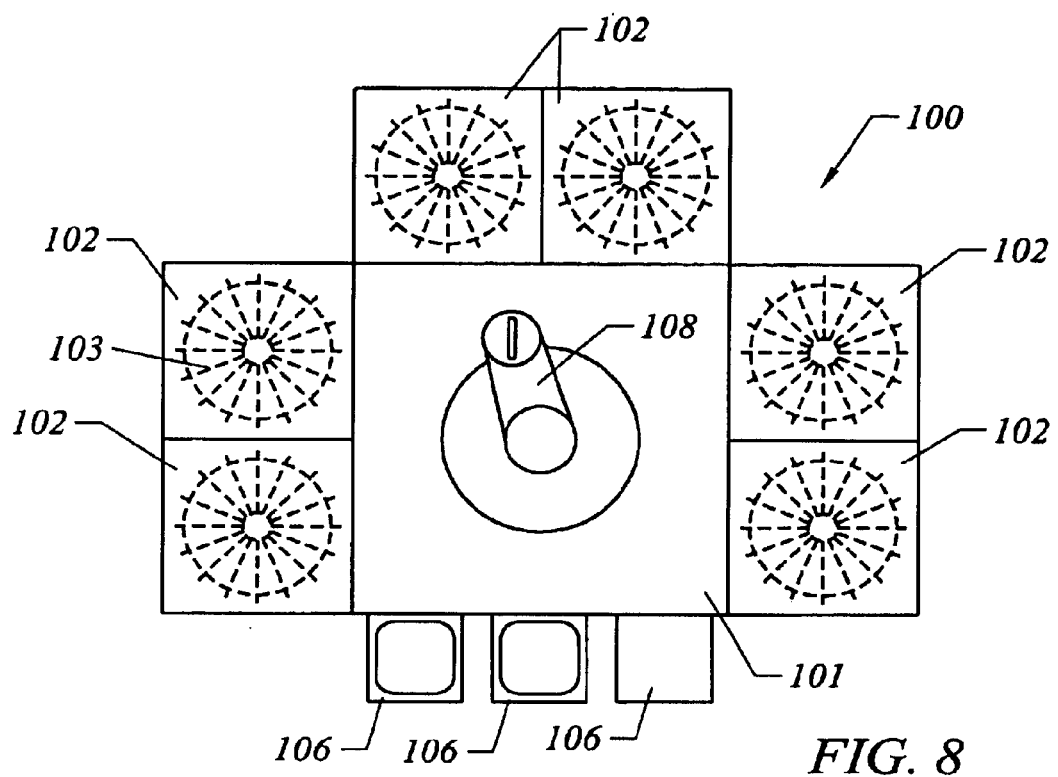
FIG. 8 is a top view of a reticle management system operating with six bare reticle stockers.

In a preferred embodiment of the present invention shown in FIG. 1, the reticle management system 100 may include up to six bare reticle stockers 102, two stockers on each of three sides of sorter 101, for manufacturers requiring large reticle storage capacities. A reticle management system configured with six bare reticle stockers is shown in FIG. 8. Alternatively, where only a small reticle storage space is needed, the reticle management system may be configured with only a single bare reticle stocker 102. It is contemplated that the reticle management system may be larger or smaller than that shown in FIG. 1 so as to hold more or less than two bare reticle stockers per side. Alternatively, it is contemplated that the reticle management system 100 may have a footprint other than a square or rectangular configuration so as to have greater than or less than three sides on which the bare reticle stockers would be located.

Up to this point, the invention has been described as relating to a reticle sorter for sorting and storing bare reticles. However, in an alternative embodiment, the sorter 101 may operate with both bare reticle stockers and closed container stockers. Such an embodiment is shown for example in FIG. 7. In accordance with this embodiment, in addition to the I/O load ports 106 on one side of the sorter, the remaining sides may all include closed container stockers 200, they may all include bare reticle stockers, or they may include a combination of closed container stockers and bare reticle stockers. As a further alternative, the closed container stockers may be provided around each side of the sorter 101. In this embodiment, one or more of the closed container stockers would include its own I/O load ports for loading and unloading closed containers to the system.

Although the type of closed container stocker used with the reticle management system 100 is not critical to the present invention, an example of a closed container stocker for use with sorter 101 is disclosed in U.S. patent application Ser. No. 08/891,543 to Bonora et al., entitled, "SMIF Pod Storage, Delivery And Retrieval System," which application is assigned to the owner of the present invention and which application is incorporated by reference in its entirety herein. The closed container storage system disclosed therein offers an advantage of small footprint, so that two such storage systems 200 may be stacked side-to-side with each other on a side of sorter 101 as shown in FIG. 7. Such a closed container storage system also offers the advantage that it is easily scaled to the size (height and length) desired by the manufacturer. As disclosed in U.S. patent application Ser. No. 08/891,543, it is understood that containers may be transferred between adjoining closed container stockers by a shuttle connected between the two adjoining stockers. It is also contemplated that conveyors may be provided between closed container reticle stockers to transfer containers between any closed container reticle stocker in the fab.

Each of the stockers 200 are preferably identical to each other, and while only one stocker 200 will be described hereinafter, the following description applies to each of the stockers 200. It is understood that in alternative embodiments, the stockers 200 need not be identical to each other. The stocker includes a plurality of shelves 202 for storing the closed containers and a transport system 204 for moving the closed containers between the shelves and a load port (not shown) for loading closed containers into the stockers 200 and for removing closed containers from the stockers 200. The stockers 200 may also be enclosed behind panels (not shown). Each closed container stocker 200 further includes a dedicated I/O load port 206 such as a conventional indexer for interfacing the stocker 200 with the sorter 101. In operation, the transport system 204 of stocker 200 carries a closed container to the I/O load port 206, which then opens the container and presents bare reticles to the sorter 101 so that individual reticles may be sorted and/or transferred into the sorter 101 by six axis robot 108.

Reticles from a container seated on load port 206 which have been transferred into the sorter 101 may subsequently be transferred back to the container on load port 206 from which they were taken. Alternatively, they may be transferred to a bare reticle stocker 102 or to a container seated on I/O load ports 106. Similarly, reticles from a container on I/O load ports 106 or within a bare reticle stocker 102 may be loaded by robot 108 into a container seated on load port 206 for subsequent storage in stocker 200. Thus, the sorter 101 may receive and transfer bare reticles to and from any of the bare reticle stockers 102 and/or the closed container stockers 200 attached to the sorter 101.

Figure 10:
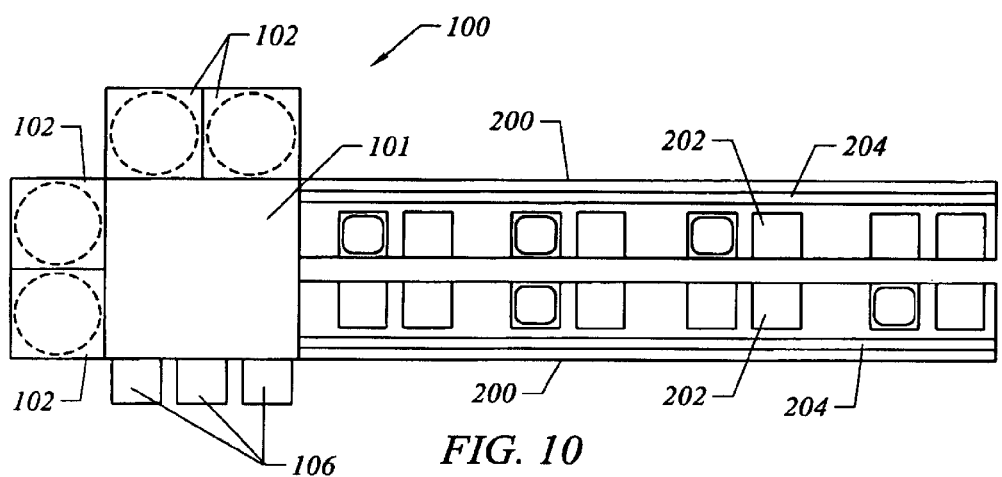
FIG. 10 is a top view of a reticle management system operating with both bare reticle stockers and closed container reticle stockers.

The reticle management system provides great flexibility for manufacturers to configure their system as necessary to meet their space and reticle storage requirements. First, the number of stockers 102/200 which may be affixed to the sorter 101 may be varied as desired by the manufacturer. Second, the system may be configured with bare reticle stockers and/or closed container stockers. As explained in the Background of the Invention section, some manufacturers need the safety and reliability of a closed container fab. Such manufacturers can configure the reticle management system 100 to include only closed container stockers 200. On the other hand, some manufactures having smaller storage requirements need a smaller footprint storage system. These manufacturers can configure the reticle management system 100 to include only the bare reticle stockers 102. Further still, the present invention provides the flexibility to configure the reticle management system 100 to include both closed container stockers 200 and bare reticle stockers 102. Such an embodiment is shown in FIG. 10.

A further advantage of the present invention is that it can be configured as a distributed system throughout the fab. Conventional stockers are large units at a single area within the fab. Thus, time and resources are devoted to transferring the workpieces from the stocker to the various tools, which may often be remote from the centralized stocker. Owing to the small size and customizability of the present invention, one embodiment of the present invention contemplates that several reticle management systems 100 be distributed throughout the fab. Thus, tools within a localized area of the fab may have their own dedicated reticle management system 100.

A further advantage of the distributed system is that each local reticle management system may be customized as necessary to best service the tools in its area. For example, it is known that some reticles, such as phase shift reticles, are more expensive to manufacture than other reticles, and these reticles require greater care than others. Thus, areas of the fab utilizing more expensive reticles may include a local reticle management system 100 configured for closed container stockers 200, and areas of the fab utilizing regular reticles may include a reticle management system 100 having bare reticle stockers 102. Similarly, some reticles must be maintained in a particular environment, such as a nitrogen environment. Reticles in this area of the fab may be serviced by a reticle management system 100 utilizing closed container stockers 200 so that the containers may be charged with nitrogen. By providing a distributed system throughout the fab, individual areas of the fab may include local storage systems which are customized for that particular area.

In a further alternative embodiment, two sorters may be adjoined side-by-side to allow hand-off and shared storage between the two sorters.

Although the invention has been described in detail herein, it should be understood that the invention is not limited to the embodiments herein disclosed. Various changes, substitutions and modifications may be made thereto by those of skill in the art without departing from the spirit or scope of the invention as described and defined by the appended claims.

We claim:

1. A reticle management system for storing individual reticles after the reticles have been removed from a SMIF pod, the SMIF pod having a pod door that is removably coupled to a pod shell, the system comprising:

a load port assembly, said load port assembly being capable of supporting the SMIF pod and separating the pod door from the pod shell to provide access to the reticles stored within the SMIF pod;

a reticle stocker adapted to store each of the reticles once the reticle has been removed from the SMIF pod, said reticle stocker including:

a rotatable central shaft;

a plurality of annular carousels coaxially aligned with and secured to said rotatable central shaft, each one of said plurality of annular carousels having multiple substantially radially oriented slots extending outward from said rotatable central shaft such that each said slot stores an individual reticle in a substantially vertical orientation;

a fan filter unit adapted to circulate clean air by the reticles seated in each said slot; and a reticle transfer mechanism for transferring reticles between said slots and the SMIF pod.

* * * * *